(12) United States Patent
Toyoda et al.

(10) Patent No.: US 9,825,102 B2
(45) Date of Patent: Nov. 21, 2017

(54) ORGANIC EL DISPLAY DEVICE

(71) Applicant: Japan Display Inc., Tokyo (JP)

(72) Inventors: Hironori Toyoda, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 515 days.

(21) Appl. No.: 14/497,365

(22) Filed: Sep. 26, 2014

(65) Prior Publication Data

US 2015/0090986 A1 Apr. 2, 2015

(30) Foreign Application Priority Data

Sep. 27, 2013 (JP) ................................. 2013-201397

(51) Int. Cl.
*H01L 29/08* (2006.01)
*H01L 27/32* (2006.01)
*H01L 51/52* (2006.01)

(52) U.S. Cl.
CPC ........ *H01L 27/322* (2013.01); *H01L 27/3209* (2013.01); *H01L 51/5278* (2013.01); *H01L 27/3213* (2013.01); *H01L 2251/5315* (2013.01); *H01L 2251/558* (2013.01)

(58) Field of Classification Search
CPC .......................... H01L 27/322; H01L 27/3209
USPC .......................................................... 257/40
See application file for complete search history.

(56) References Cited

U.S. PATENT DOCUMENTS

| | | | | |
|---|---|---|---|---|
| 9,048,447 B2 * | 6/2015 | Cho | ..................... | H01L 51/5044 |
| 9,196,870 B2 * | 11/2015 | Wehlus | ............... | H01L 51/5044 |
| 9,653,705 B2 * | 5/2017 | Uesaka | ............... | H01L 51/5265 |
| 2007/0182317 A1 | 8/2007 | Kido et al. | | |
| 2015/0090986 A1 * | 4/2015 | Toyoda | ............... | H01L 51/5278 257/40 |
| 2016/0043338 A1 * | 2/2016 | Seo | ..................... | H01L 51/5215 257/89 |
| 2016/0118625 A1 * | 4/2016 | Uesaka | ............... | H01L 27/3213 257/40 |
| 2016/0126501 A1 * | 5/2016 | Kim | ..................... | H01L 51/5268 257/40 |
| 2016/0133878 A1 * | 5/2016 | Uesaka | ............... | H01L 27/1225 257/40 |
| 2016/0293676 A1 * | 10/2016 | Komatsu | .................. | G02B 5/20 |
| 2017/0179435 A1 * | 6/2017 | Seo | ..................... | H01L 51/5265 |

FOREIGN PATENT DOCUMENTS

| | | |
|---|---|---|
| JP | 2003-272860 A | 9/2003 |
| JP | 2010-146893 A | 7/2010 |
| JP | 2010-192472 A | 9/2010 |

* cited by examiner

*Primary Examiner* — Jami M Valentine
(74) *Attorney, Agent, or Firm* — Typha IP LLC

(57) ABSTRACT

An organic EL display device includes: a TFT substrate that includes a display area in which pixels are arranged in a matrix; and a color filter substrate that is provided to face the TFT substrate and includes an area transmitting light in a predetermined wavelength range for each of the pixels. Each of the pixels of the TFT substrate includes a pair of electrodes, at least two light emission layers that are arranged between the pair of electrodes, and a charge generation layer that is arranged between the at least two light emission layers, is a layer to generate a pair of positive and negative charges, and has different film thicknesses in accordance with the predetermined wavelength range of the corresponding area.

3 Claims, 10 Drawing Sheets

ORGANIC EL DISPLAY DEVICE

CROSS-REFERENCE TO RELATED APPLICATION

The present application claims priority from Japanese patent application JP2013-201397 filed on Sep. 27, 2013, the content of which is hereby incorporated by reference into this application.

BACKGROUND OF THE INVENTION

1. Field of the Invention

The present invention relates to an organic EL display device.

2. Description of the Related Art

In recent years, an image display device using a self-luminous body called an organic light-emitting diode (OLED) (hereinafter referred to as an "organic EL (Electro-Luminescent) display device") has been put to practical use. Since the self-luminous body is used, the organic EL display device is superior in terms of visibility and response speed compared to a related-art liquid crystal display device, and in addition, a further reduction in thickness is possible because an auxiliary lighting device such as a backlight is not necessary.

For color display in such an organic EL display device, there are primarily two kinds of methods: one is to provide light-emitting elements that respectively emit lights of three colors of R (red), G (green), and B (blue) for each pixel; and the other is to emit white light in light-emitting elements and allow lights in respective wavelength ranges of three colors of R, G, and B to transmit through color filters of pixels.

JP 2003-272860 A discloses an organic EL element using a charge generation layer. JP 2010-146893 A discloses an organic EL element in which a film having a high haze value is provided to improve light extraction efficiency. JP 2010-192472 A discloses an organic EL element in which the refractive index of an anode and the refractive index of a substrate are set so as to satisfy a predetermined condition to enhance light extraction efficiency.

SUMMARY OF THE INVENTION

In the organic EL display device that transmits light in the wavelength ranges of the respective colors using color filters, a phenomenon called color mixture occurs to no small extent in which light exits through a color filter of an adjacent pixel adjacent to a color filter through which the light originally exits. It is considered that such color mixture is caused by both optical color mixture and electrical color mixture. The optical color mixture occurs when light that exited in an oblique direction from a light-emitting area of a pixel exits through a color filter of an adjacent pixel. The electrical color mixture occurs when charges flow into an adjacent pixel to cause light emission in a light-emitting area of the adjacent pixel.

The invention has been made in view of the circumstances described above, and it is an object of the invention to provide an organic EL display device in which an influence on chromaticity is suppressed in electrical color mixture as one of the causes of color mixture.

An organic EL display device according to an aspect of the invention includes: a TFT (Thin Film Transistor) substrate that includes a display area in which pixels are arranged in a matrix; and a color filter substrate that is provided to face the TFT substrate and includes an area transmitting light in a predetermined wavelength range for each of the pixels, wherein each of the pixels of the TFT substrate includes a pair of electrodes, at least two light emission layers that are arranged between the pair of electrodes, and a charge generation layer that is arranged between the at least two light emission layers, is a layer to generate a pair of positive and negative charges, and has different film thicknesses in accordance with the predetermined wavelength range of the corresponding area.

In the organic EL display device according to the aspect of the invention, the areas of the color filter substrate may be areas that transmit lights in wavelength ranges respectively corresponding to R (red), G (green), B (blue), and W (white), and the film thickness of the charge generation layer of the pixels corresponding to W and G in the TFT substrate may be thicker than the film thickness of the charge generation layer corresponding to R and B.

In the organic EL display device according to the aspect of the invention, the areas of the color filter substrate may be areas that transmit lights in wavelength ranges respectively corresponding to R (red), G (green), and B (blue), and the film thickness of the charge generation layer of the pixel corresponding to G in the TFT substrate may be thicker than the film thickness of the charge generation layer corresponding to R and B.

In the organic EL display device according to the aspect of the invention, the two light emission layers may be composed of a light emission layer that emits light in a wavelength range corresponding to B (blue) and a light emission layer that emits light in a wavelength range corresponding to Y (yellow).

DETAILED DESCRIPTION OF THE INVENTION

Figure 1:
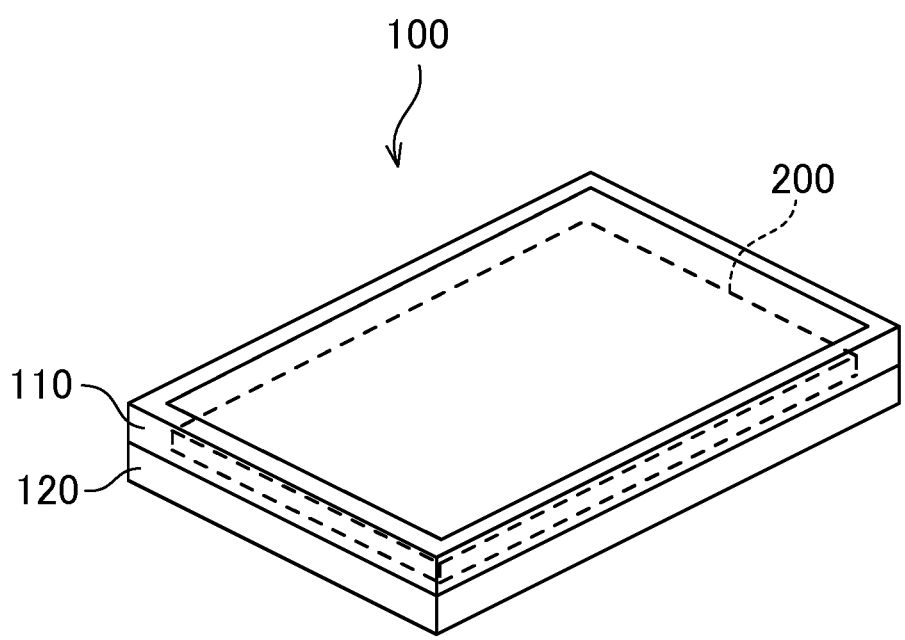
FIG. 1 is a diagram schematically showing an organic EL display device according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 schematically shows an organic EL display device 100 according to the embodiment of the invention. As shown in the drawing, the organic EL display device 100 is composed of an organic EL panel 200 fixed so as to be interposed between an upper frame 110 and a lower frame 120.

Figure 2:
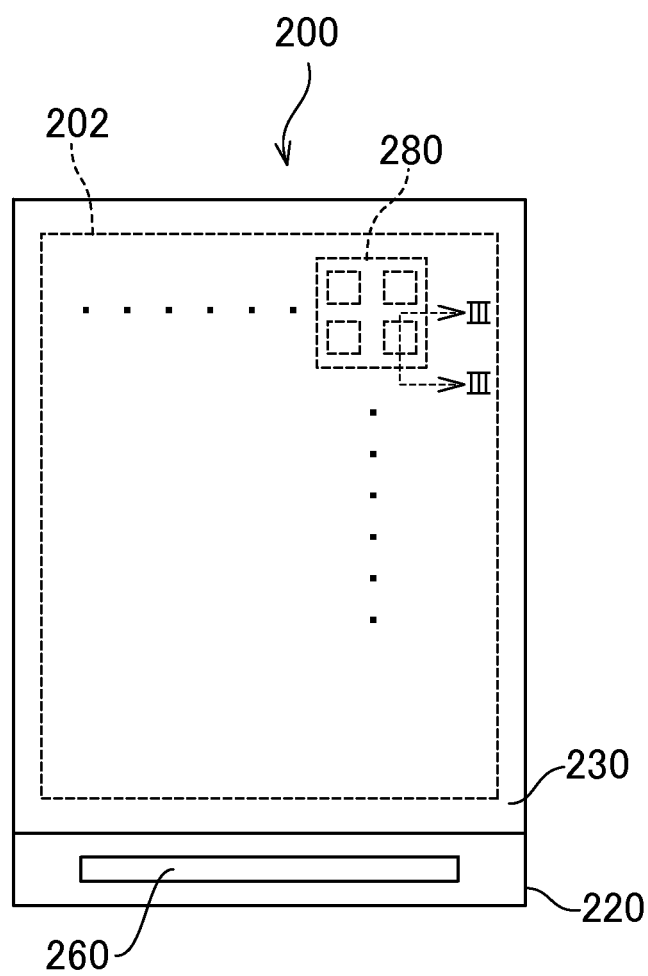
FIG. 2 is a diagram showing the configuration of an organic EL panel in FIG. 1.

FIG. 2 shows the configuration of the organic EL panel 200 in FIG. 1. The organic EL panel 200 includes two substrates, a TFT (Thin Film Transistor) substrate 220 and a color filter substrate 230. A space between the substrates is filled with a transparent resin (not shown). The TFT substrate 220 includes pixels 280 arranged in a matrix in a display area 202. Moreover, in the embodiment, each of the pixels 280 includes four sub-pixels. The TFT substrate 220 includes a driver IC (Integrated Circuit) 260 as a driver circuit that applies, to a scanning signal line (not shown) of a pixel transistor arranged in each of the sub-pixels, a potential for providing electrical continuity between the source and drain of the pixel transistor, and applies, to a data signal line of each of the pixel transistors, a voltage corresponding to the gradation value of the sub-pixel.

Figure 3:
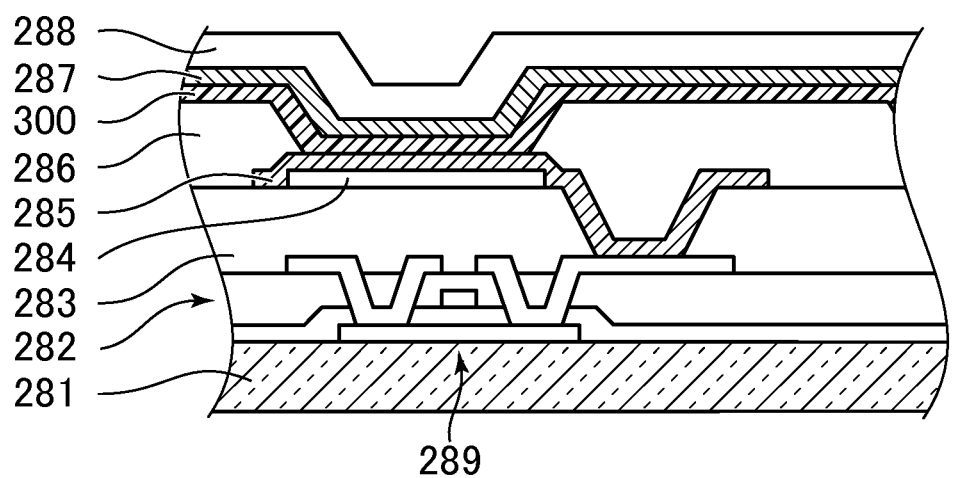
FIG. 3 is a diagram schematically showing a cross-section of a TFT substrate taken along the line III-III in FIG. 2.

FIG. 3 is a diagram schematically showing a cross-section of the TFT substrate 220 taken along the line III-III in FIG. 2. As shown in the drawing, the TFT substrate 220 includes a glass substrate 281 as an insulating substrate, a TFT circuit layer 282 that is formed on the glass substrate 281 and in which circuits including pixel transistors 289 and the like are formed, a planarization film 283 that is formed of an insulating material on the TFT circuit layer 282, anode electrodes 285 each of which is connected to the circuit of the TFT circuit layer 282 via a through-hole opened through the planarization film 283, insulating banks 286 that cover edges of the anode electrodes 285 and each insulate electrodes from each other between the sub-pixels, an organic layer 300 that includes common layers such as a light emission layer, an electron injection layer, and a hole transport layer that are formed on the anode electrodes 285 and the insulating banks 286 so as to cover the entire display area 202, a reflective layer 284 that reflects light emitted in the light emission layer, a cathode electrode 287 that is formed on the organic layer 300 so as to cover the entire display area 202, and a sealing film 288 that blocks the entry of the air or water from the outside for preventing the deterioration of the organic layer 300. A current controlled by the pixel transistor 289 flows through the organic layer 300 between the anode electrode 285 and the cathode electrode 287, whereby each of the sub-pixels emits light in the light emission layer in the organic layer 300.

Figure 4:
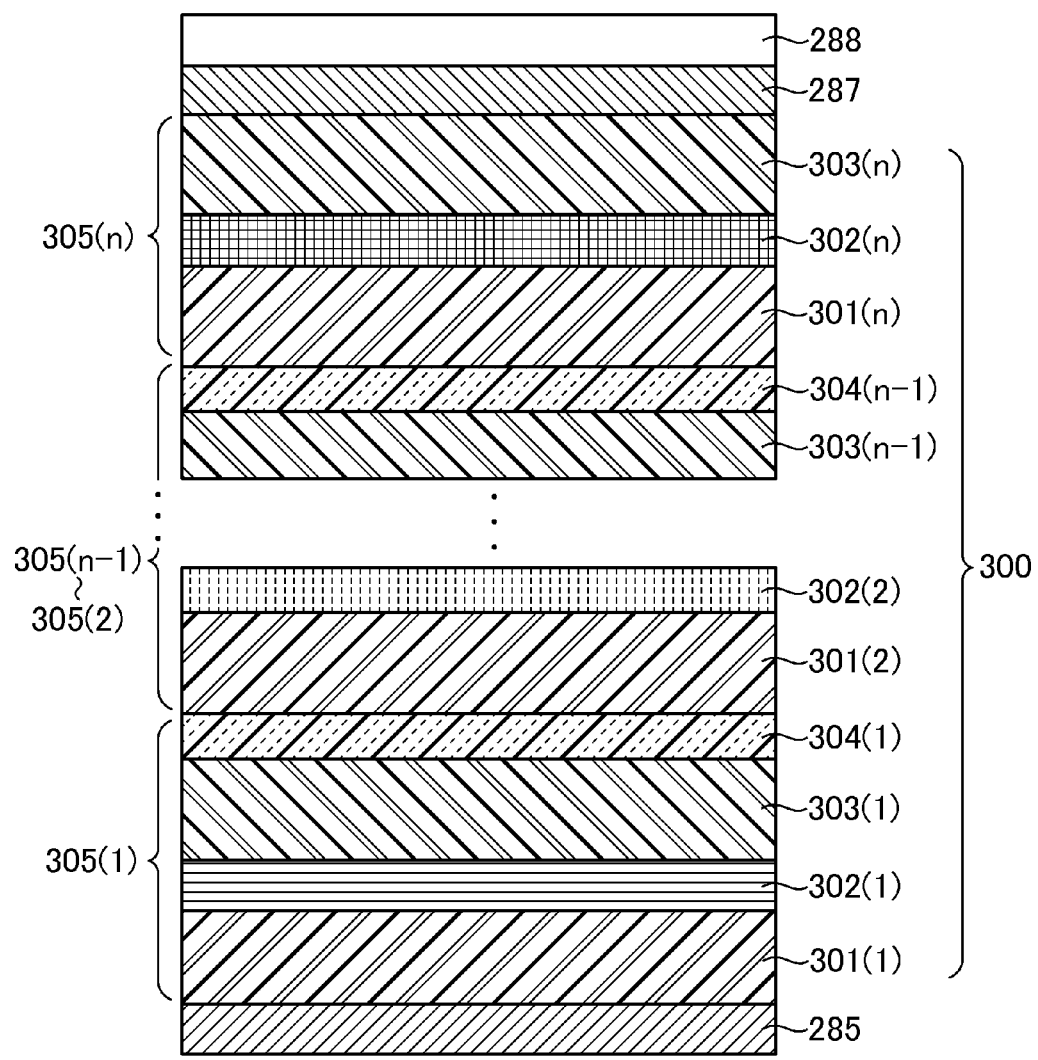
FIG. 4 is a diagram schematically showing the stacked structure of an organic layer.

FIG. 4 is a diagram schematically showing the stacked structure of the organic layer 300. As shown in the drawing by way of example, the organic layer 300 formed between the anode electrode 285 and the cathode electrode 287 has a so-called tandem structure including n layers (n is plural) of light emission layers, and is composed of n layers of units 305. The units 305 have such a structure that each of the units 305 includes a hole transport layer (HTL) 301, a light emission layer (EML) 302, and an electron transport layer (ETL) 303 in this order from the anode electrode 285 side, and when the unit 305 is further overlaid, a charge generation layer (CGL) 304 is interposed between the units 305. Here, a description will be briefly given of how to emit light. Holes injected from the anode electrode 285 travel through the hole transport layer 301 and the light emission layer 302 in this order, while electrons injected from the cathode electrode 287 travel through the electron transport layer 303 and the light emission layer 302 in this order. The holes and electrons are recombined in the light emission layer 302 to form an excited state, and light emission occurs when the state transits to a ground state. A compound used for each of the hole transport layer 301, the light emission layer 302, the electron transport layer 303, and the charge generation layer 304 is a well-known compound, and therefore, the description thereof is omitted. The present inventors of the invention have conceived that electrical color mixture is caused by the charge generation layer acting as a conductive layer to an adjacent pixel, and have configured an organic EL element as described below.

Figure 5:
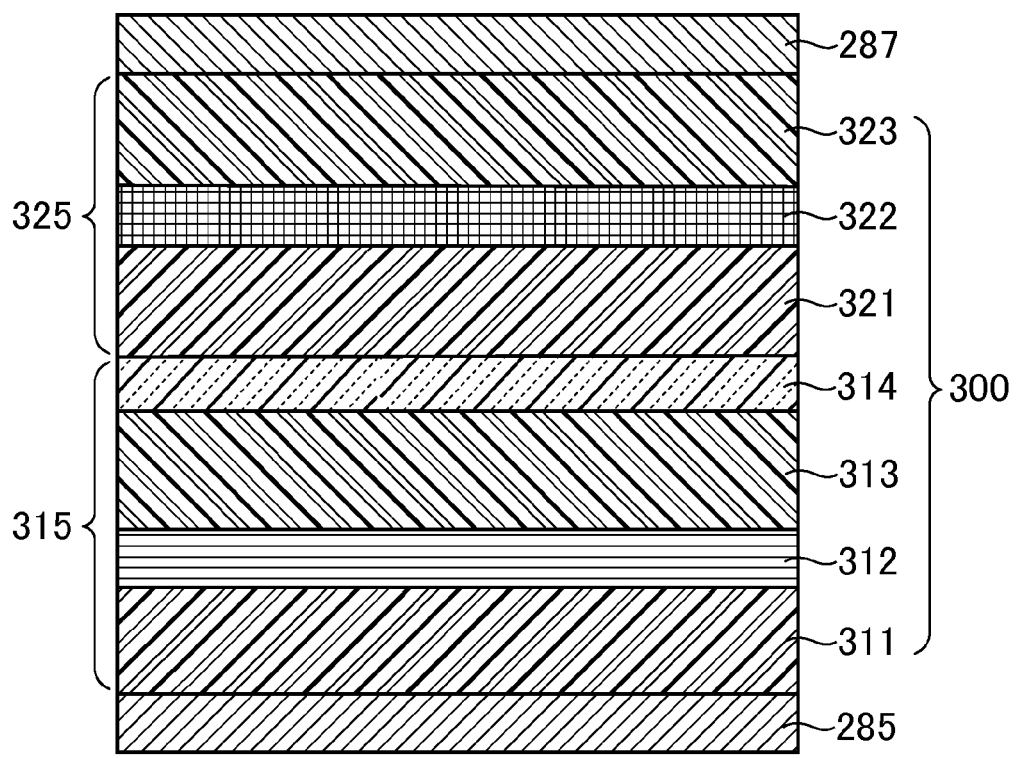
FIG. 5 is a diagram showing an organic layer in which the number of units is two.

FIG. 5 is a diagram showing the organic layer 300 used in the embodiment in which the number of units is two. As shown in the drawing, the organic layer 300 is composed of a first unit 315 and a second unit 325. The first unit 315 includes a hole transport layer 311, a blue light emission layer 312 that emits blue light, an electron transport layer 313, and a charge generation layer 314. The second unit 325 includes a hole transport layer 321, a yellow light emission layer 322 that emits yellow light, and an electron transport layer 323. In the organic layer 300, blue light and yellow light are simultaneously emitted, whereby white light is emitted as a whole. However, the organic layer 300 may have a configuration having other luminescent colors than these lights, or may have a configuration in which the number of units is three or more.

Figure 6:
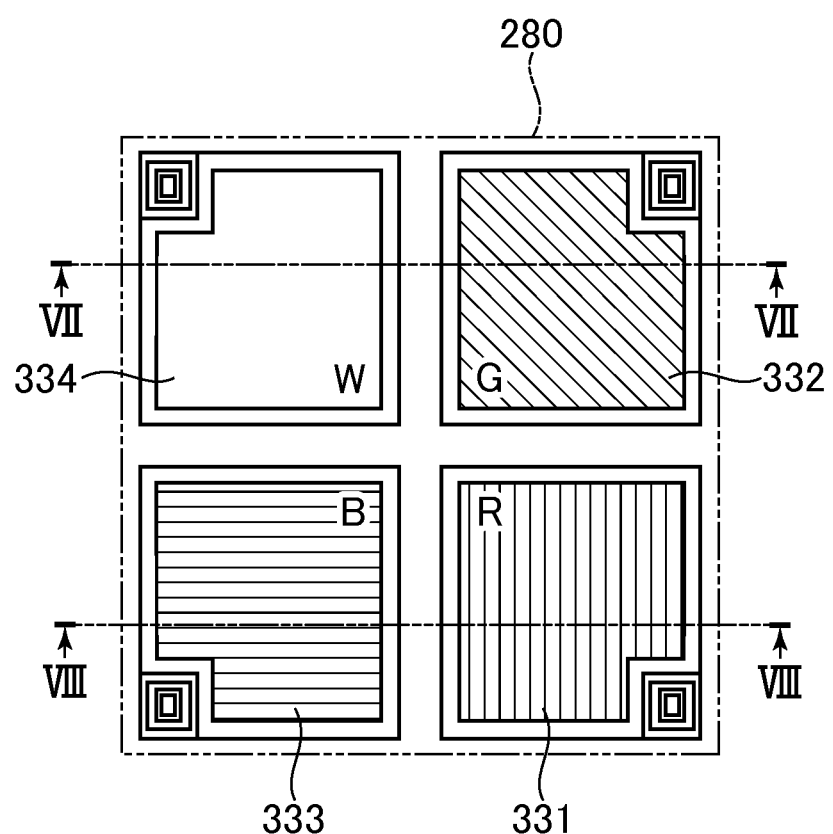
FIG. 6 is a diagram showing sub-pixels constituting a pixel.

FIG. 6 is a diagram showing sub-pixels constituting the pixel 280. As shown in the drawing, the pixel 280 is composed of four sub-pixels, an R (red) sub-pixel 331, a G (green) sub-pixel 332, a B (blue) sub-pixel 333, and a W (white) sub-pixel 334. The color filter substrate 230 includes color filters that transmit lights in wavelength ranges corresponding to the respective colors. The W lights emitted from the respective sub-pixels exit through the color filters as the corresponding R, G, B, and W lights.

Figure 7:
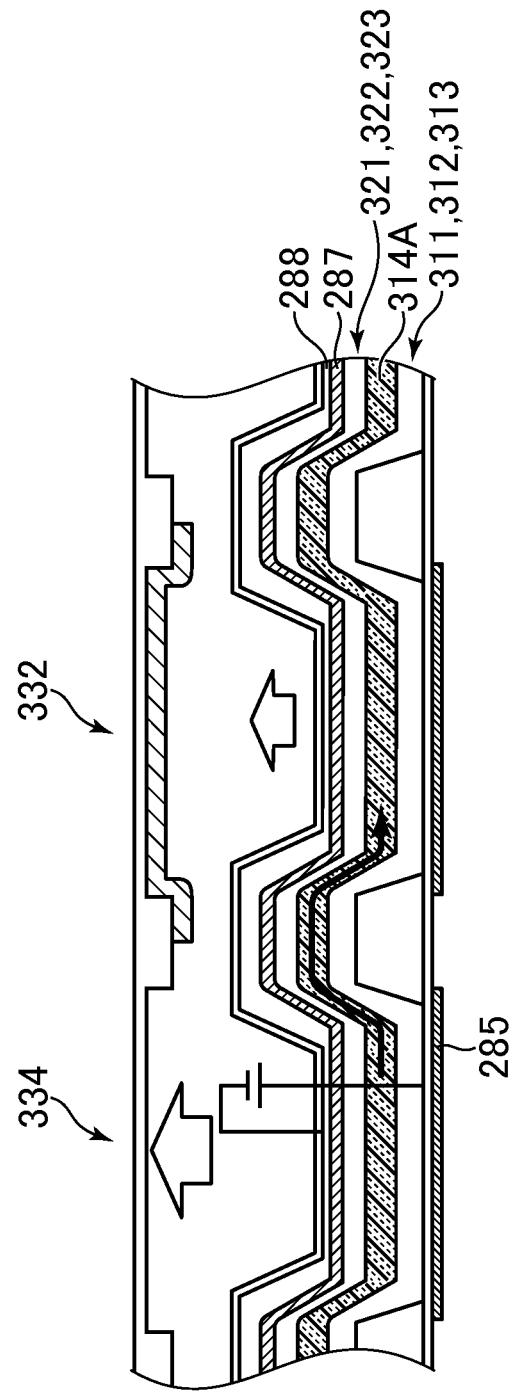
FIG. 7 is a diagram showing a cross-section taken along the line VII-VII in FIG. 6.
Figure 8:
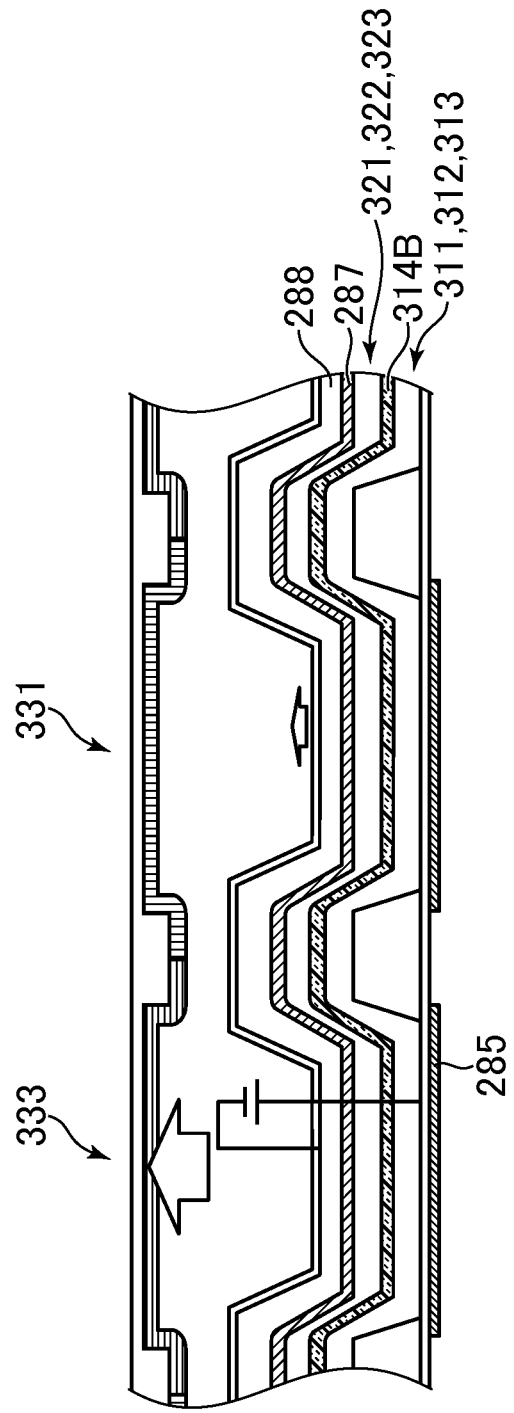
FIG. 8 is a diagram showing a cross-section taken along the line VIII-VIII in FIG. 6.

FIG. 7 is a diagram showing a cross-section taken along the line VII-VII in FIG. 6. FIG. 8 is a diagram showing a cross-section taken along the line VIII-VIII in FIG. 6. In these drawings, only the charge generation layer 314 of the layers included in the organic layer 300 is differently shown for the sake of description. FIG. 7 is a diagram showing cross-sections of the W sub-pixel 334 and the G sub-pixel 332, showing the case where light emission occurs in the blue light emission layer 312 and the yellow light emission layer 322 of the W sub-pixel 334. In this case, a portion of electrons generated in a charge generation layer 314A of the W sub-pixel 334 flows into the G sub-pixel 332 adjacent thereto, causing light emission (color mixture) in the G sub-pixel 332. The W sub-pixel 334 and the G sub-pixel 332 are pixels that respectively allow lights in W and G wavelength ranges to exit, and the W and G wavelength ranges are wavelength ranges that contribute luminance out of chromaticity and luminance. Therefore, even when such electrical color mixture occurs, a change in chromaticity is limited and not much perceived by human vision. In the meantime, since the area of light emission is widened, and light emission in the G sub-pixel 332 is superimposed, current efficiency is enhanced.

FIG. 8 is a diagram showing cross-sections of the B sub-pixel 333 and the R sub-pixel 331, showing the case where light emission occurs in the blue light emission layer 312 and the yellow light emission layer 322 of the B sub-pixel 333. The charge generation layer 314 of the B sub-pixel 333 and the R sub-pixel 331 is formed of a charge generation layer 314B thinner than the charge generation layer 314A of the W sub-pixel 334 and the G sub-pixel 332. For this reason, electrons generated in the charge generation layer 314B of the B sub-pixel 333 scarcely flow into the R sub-pixel 331 adjacent thereto. Hence, electrical color mixture is less likely to occur between the B sub-pixel 333 and the R sub-pixel 331. Since the B sub-pixel and the R sub-pixel are pixels for wavelength ranges that bear chromaticity rather than luminance, an image with higher quality can be displayed by suppressing the electrical color mixture between these pixels.

Figure 9:
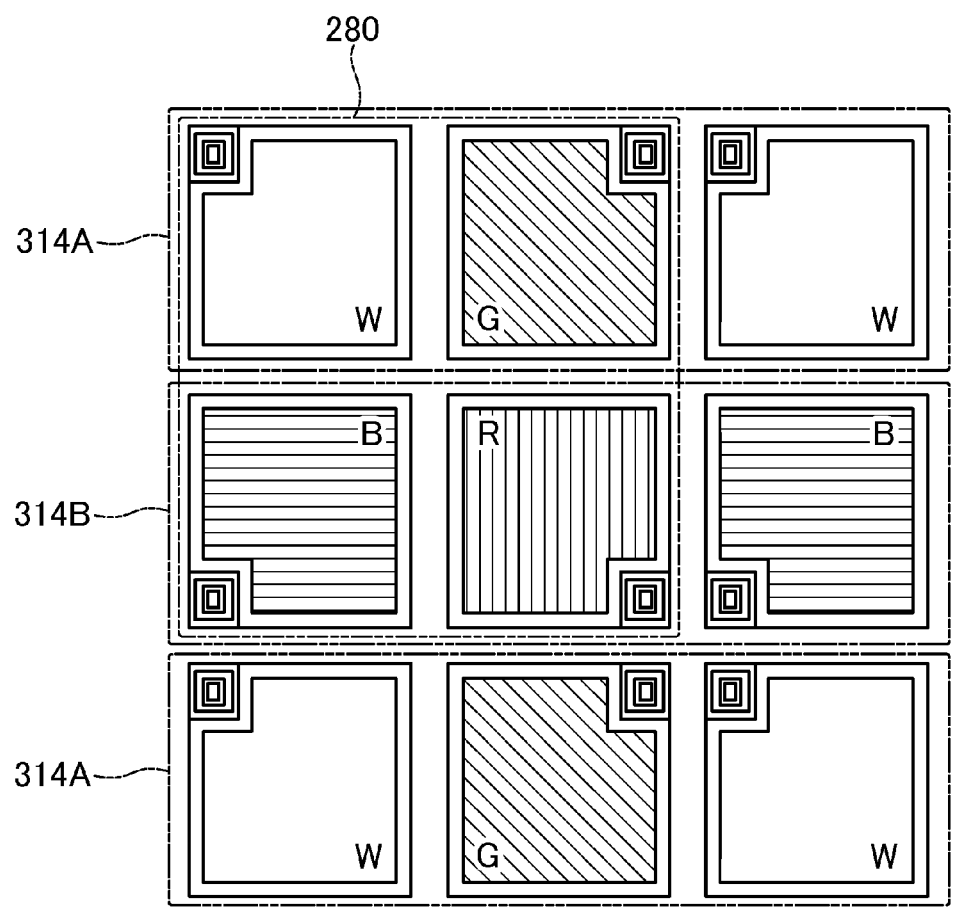
FIG. 9 is a diagram schematically showing the arrangement of a thick charge generation layer and a thin charge generation layer.

FIG. 9 is a diagram schematically showing the arrangement of the thick charge generation layer 314A and the thin charge generation layer 314B. As shown in the drawing, the charge generation layer 314A and the charge generation layer 314B are alternately formed in a stripe pattern in the pixel arrangement of the embodiment. Therefore, even when the charge generation layers are formed by, for example, deposition, the thin charge generation layer 314B is formed in the entire display area, and then, the charge generation layer 314A is formed only at portions to be formed thick additionally using a deposition mask.

In the embodiment as has been described above, the electrical color mixture between the B sub-pixel 333 and the R sub-pixel 331 is suppressed while the electrical color mixture between the W sub-pixel 334 and the G sub-pixel 332 is permitted to some extent. Therefore, an influence on chromaticity in vision is minimized, so that an image with high quality can be displayed. Moreover, since movement of electrons occurs between the W sub-pixel 334 and the G sub-pixel 332 so as to compensate luminance, current efficiency can be enhanced.

Figure 10:
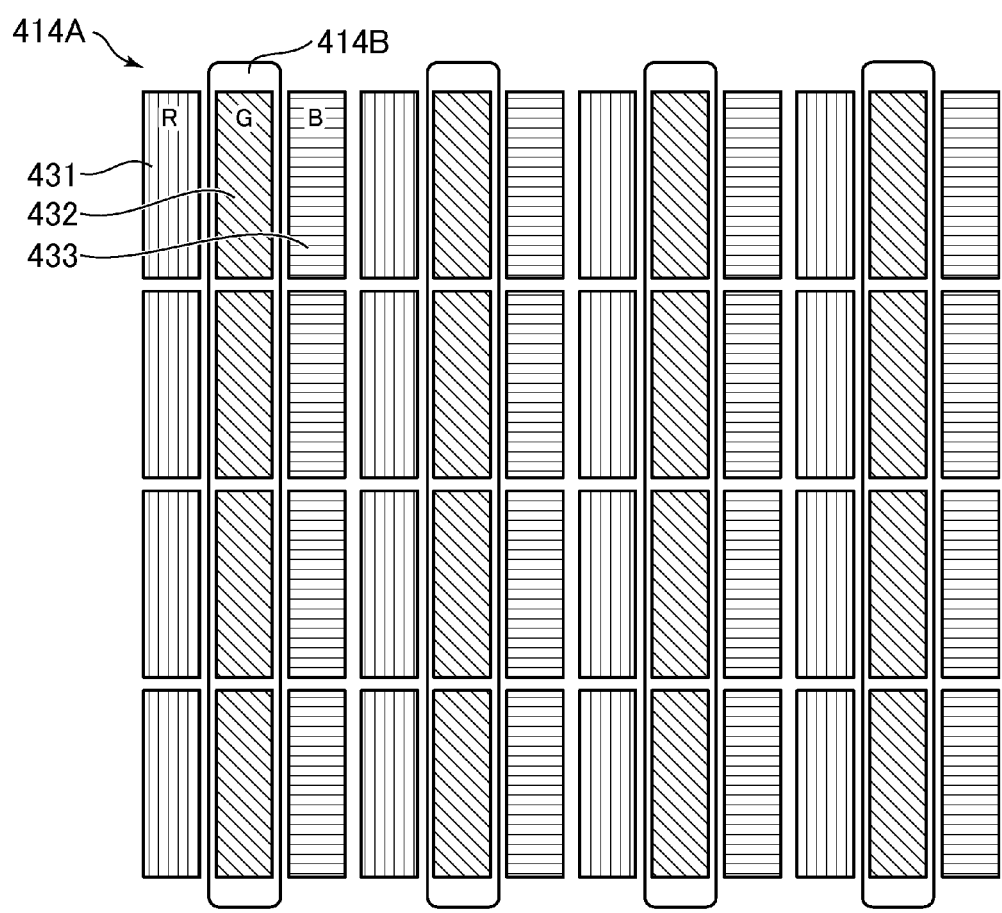
FIG. 10 is a diagram schematically showing the arrangement of a charge generation layer of an organic EL display device including three kinds of R, G, and B sub-pixels in each pixel as a modified example of the embodiment.

FIG. 10 is a diagram showing the arrangement of a charge generation layer 414 of an organic EL display device including three kinds of sub-pixels, an R sub-pixel 431, a G sub-pixel 432, and a B sub-pixel 433, in each of pixels as a modified example of the embodiment. As shown in the drawing, the R sub-pixels, the G sub-pixels, and the B sub-pixels are respectively arranged so as to be lined up in the vertical direction in the modified example. In this case, a thin charge generation layer 414A is formed in the R sub-pixel 431 and the B sub-pixel 433, while a thick charge generation layer 414B is formed in the G sub-pixel 432. Hence, also in the modified example, the thin charge generation layer 414A is formed in the entire display area, and then, the charge generation layer 414B is formed only at portions to be formed thick additionally using a deposition mask. Moreover, similarly to the embodiment described above, electrical color mixture between the B sub-pixel 433 and the R sub-pixel 431 is suppressed while electrical color mixture between the G sub-pixels 432 is permitted to some extent. Therefore, an advantageous effect similar to that of the embodiment described above can be obtained.

In the embodiment and modified example described above, examples of the number and arrangement of sub-pixels in each pixel are shown. However, the invention is applicable even when the number and arrangement of sub-pixels are other than those of the embodiment and modified example.

In the embodiment and modified example described above, the organic EL display device is of top emission type. However, the organic EL display device may be of bottom emission type.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
a substrate on which a plurality of pixels are arranged in a matrix, the plurality of pixels including red pixels for emitting red light, green pixels for emitting green light, and blue pixels for emitting blue light;
an anode electrode in each of the plurality of pixels on the substrate;
a first light emission layer on the anode electrode;
a single charge generation layer for generating a pair of positive and negative charges, on the first light emission layer, the single charge generation layer extending over the red pixels, green pixels, and blue pixels, and the single charge generation layer having a first film thickness and a second film thickness, the first film thickness in the green pixels is greater than the second film thickness in the red pixels and the blue pixels;
a second light emission layer on the single charge generation layer;
a cathode electrode on the second light emission layer;
a red color filter in each of the red pixels;
a green color filter in each of the green pixels; and
a blue color filter in each of the blue pixels.

2. The organic EL display device according to claim 1, wherein
the plurality of pixels further include white pixels for emitting white light,
a white color filter is disposed in each of the white pixels, and
the first film thickness in the white pixels is greater than the second film thickness in the red pixels and the blue pixels.

3. The organic EL display device according to claim 2, wherein
one of the first light emission layer and the second light emission layer is configured to emit light in a wavelength range corresponding to yellow, and
another of the first light emission layer and the second light emission layer is configured to emit light in a wavelength range corresponding to blue.

* * * * *